(12) United States Patent
Funahara et al.

(10) Patent No.: US 6,380,662 B2
(45) Date of Patent: Apr. 30, 2002

(54) PIEZOELECTRIC OSCILLATOR

(75) Inventors: Toshikazu Funahara, Omihachiman; Akiyoshi Moriyasu, Moriyama; Tadashi Kani, Kyoto; Makoto Fujita, Kusatsu, all of (JP)

(73) Assignee: Murata Manufacturing Co., LTD, Kyoto (JP)

( * ) Notice: Subject to any disclaimer, the term of this patent is extended or adjusted under 35 U.S.C. 154(b) by 0 days.

(21) Appl. No.: 09/734,160

(22) Filed: Dec. 11, 2000

(30) Foreign Application Priority Data

Dec. 9, 1999 (JP) .......................................... 11-350573

(51) Int. Cl.[7] .......................................... H01L 41/053
(52) U.S. Cl. ...................................... 310/348; 310/349
(58) Field of Search ................................. 310/348, 349

(56) References Cited

U.S. PATENT DOCUMENTS

| | | | | |
|---|---|---|---|---|
| 4,295,009 A | * | 10/1981 | Weidler | 310/348 |
| 5,371,428 A | * | 12/1994 | Kikuchi et al. | 310/324 |
| 5,682,187 A | * | 10/1997 | Watanabe et al. | 347/45 |
| 6,114,800 A | * | 9/2000 | Unami et al. | 310/344 |

FOREIGN PATENT DOCUMENTS

| | | | | |
|---|---|---|---|---|
| JP | 60-18352 | * | 1/1985 | 310/348 |
| JP | 2-290972 | * | 4/1989 | 310/348 |
| JP | 6-232527 | | 8/1994 | H05K/1/18 |

* cited by examiner

Primary Examiner—Thomas M. Dougherty
(74) Attorney, Agent, or Firm—Keating & Bennett, LLP

(57) ABSTRACT

A compact quartz oscillator includes a quartz vibrator that is integrally mounted on a circuit substrate. In the quartz oscillator, flux residue can be easily washed away. A cavity is defined in the approximate center of the circuit substrate. Within the cavity, circuit components defining an oscillation circuit, a temperature-compensating circuit, and other such circuits are surface-mounted preferably via reflow soldering. Connection electrodes are disposed at the four corners of walls surrounding the cavity. The connection electrodes are bonded to electrodes of the quartz vibrator mounted on the circuit substrate preferably via reflow soldering. Recesses are provided in the top surfaces of the walls. With the recesses, clearances are created between the circuit substrate and the quartz vibrator. As a result, in order to wash away flux residue.

20 Claims, 3 Drawing Sheets

PIEZOELECTRIC OSCILLATOR

BACKGROUND OF THE INVENTION

1. Field of the Invention

The present invention relates to piezoelectric oscillators. More particularly, the invention relates to surface-mount type piezoelectric oscillators including quartz vibrators and providing reference frequencies used for mobile terminals.

2. Description of the Related Art

Conventionally, a surface-mounted-type quartz oscillator includes a quartz vibrator as a discrete packaged component. In the quartz oscillator, a quartz vibrator package containing a quartz member is disposed on a box-shaped circuit substrate having surface-mounted circuit components defining an oscillation circuit, a temperature-compensating circuit, and other such circuits. In addition, connection electrodes disposed on the upper surface of the circuit substrate are bonded via solder with electrodes disposed on the lower surface of the quartz vibrator package. With this arrangement, the quartz vibrator is electrically connected to the oscillation circuit, the temperature-compensating circuit, and other such circuits. Furthermore, the circuit substrate is mechanically coupled to the quartz vibrator package.

In the quartz oscillator, when the circuit components to be surface-mounted are disposed on the circuit substrate, first, the circuit components such as a transistor, a capacitor, and a resistor, are temporarily fixed to the circuit substrate by solder paste. In addition, solder paste is applied between the electrodes disposed on the upper surface of the circuit substrate and the electrodes on the lower surface of the quartz vibrator package to mount the quartz vibrator package on the circuit substrate. Then, the quartz oscillator is heated in a reflow furnace, in order to bond the circuit components and the quartz vibrator package to the circuit substrate by reflow soldering.

However, as described above, when the circuit components and the quartz vibrator package are mounted by reflow soldering, it is necessary to remove flux residue remaining after soldering because the flux residue tends to corrode a portion of the electrodes disposed on the circuit substrate and portions of the circuit components. As a result, functional problems including frequency variation are caused in the quartz oscillator.

In order to remove such flux residue, the quartz oscillator after soldering is washed with cleaning solution to dissolve the residue. As the cleaning solution, chlorofluoro hydrocarbon solvents used to be applied. However, recently, there has been concern about the depletion of the ozone layer due to chlorofluoro hydrocarbon. Thus, the use of water-based cleaning solutions and chlorofluoro hydrocarbon substitute solvents having an inferior cleaning effect has been necessitated. On the other hand, it is difficult for the water-based cleaning solutions and the chlorofluoro hydrocarbon substitute solvents, as alternatives to the chlorofluoro hydrocarbon solvents, to enter clearances between the circuit substrate and the quartz vibrator package. As a result, the flux residue cannot be sufficiently removed. In addition, such cleaning solutions or solvents are not easily discharged and often remain in the quartz oscillator after cleaning.

Meanwhile, in Japanese Unexamined Patent Application Publication No. 6-232527, small holes or slits are formed in a main surface of a printed circuit board to wash away the flux residue, and a chlorofluoro hydrocarbon substitute solvent can easily enter the small holes or the slits. However, it is very difficult to form such small holes or slits in the main surface of the circuit substrate since circuit components are densely packed on the main surface of the circuit board, which requires miniaturization while maintaining a high integration density. In addition, wiring patterns are arranged in a grid form. As a result, in order to form small holes or recesses in such a structure, the size of the circuit board must be increased.

SUMMARY OF THE INVENTION

In order to overcome the problems described above, preferred embodiments of the present invention provide a compact piezoelectric oscillator having a structure that allows a cleaning solution to reliably flow and spread through the inside portion of the piezoelectric oscillator and then be reliably discharged from the oscillator.

According to one preferred embodiment of the present invention, there is provided a piezoelectric oscillator including a circuit substrate, a cavity defined in the upper surface of the circuit substrate for mounting therein at least one circuit component to be mounted on the circuit substrate, a vibrator package containing a portion of piezoelectric member, the vibrator package arranged to be integrally mounted on the circuit substrate so as to cover the cavity, and a clearance defined in a wall surrounding the cavity of the circuit substrate to connect the inside of the cavity and the outside thereof.

In the above-described piezoelectric oscillator, since the wall surrounding the cavity has the clearance defined therein, a cleaning solution can easily enter the inside of the oscillator through the clearance of the circuit substrate. As a result, even when flux residue remains on the circuit substrate or between the circuit substrate and the vibrator package after soldering, the flux residue can be completely washed away. Moreover, the cleaning solution can easily be discharged through the clearance of the circuit substrate after the cleaning. With this arrangement, changes in the frequency of the piezoelectric oscillator occurring with the passage of time are minimized. Thus, over a long period of time, the piezoelectric oscillator can maintain high frequency accuracy.

In addition, when the temperature of the piezoelectric oscillator decreases abruptly, for example, when an apparatus incorporating the piezoelectric oscillator is moved into a lower temperature environment, condensation can occur on the circuit substrate. However, the arrangement of preferred embodiments of the present invention permits moisture content to evaporate quickly through the clearance. Thus, the influence of condensation on the circuitry is minimized.

Moreover, since the clearance is defined in the wall surrounding the cavity of the circuit substrate, it is unnecessary to reduce the area for mounting components on the circuit substrate, and the clearance is not a hindrance to the design of the wiring patterns. Also, the clearance does not hinder the miniaturization of the piezoelectric oscillator.

In the above piezoelectric oscillator, the clearance may be defined in each of two opposing walls of the cavity such that both clearances do not face each other.

In this case, since the clearances are arranged so as not to face each other, a cleaning solution can easily spread over every part of the circuit substrate. In addition, the cleaning solution can be quickly discharged after the cleaning.

Furthermore, in the piezoelectric oscillator of preferred embodiments of the present invention, each clearance may be defined on an edge of the wall.

In the piezoelectric oscillator having the clearance defined in the edge of the wall of the circuit substrate, the clearance can be easily formed when the circuit substrate is manufactured. Thus, an increase in manufacturing cost is prevented even though the advantageous clearance is provided.

Other features, characteristics, elements and advantages of the present invention will become apparent from the following detailed description of preferred embodiments with reference to the attached drawings.

DETAILED DESCRIPTION OF PREFERRED EMBODIMENTS

Figure 1:
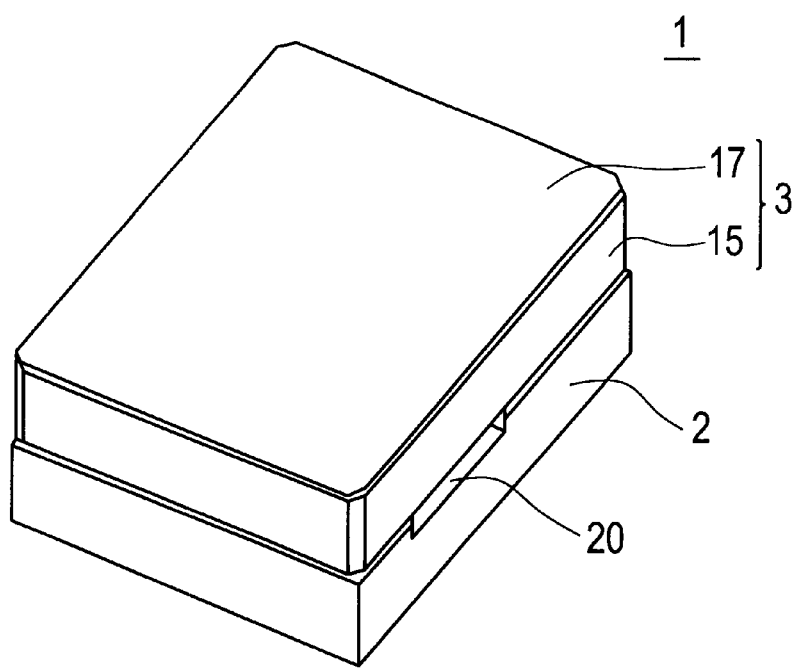
FIG. 1 is a perspective view of a quartz oscillator according to a first preferred embodiment of the present invention.
Figure 2:
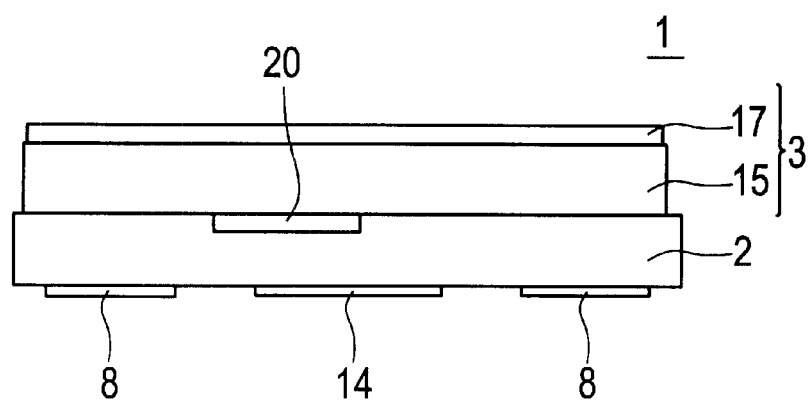
FIG. 2 is a side view of the quartz oscillator in FIG. 1.

FIG. 1 shows a perspective view of a temperature-compensating-type quartz oscillator 1 according to a first preferred embodiment of the present invention. FIG. 2 shows a side view thereof. The quartz oscillator 1 has a structure in which a surface-mounted-type quartz vibrator package 3 (hereinafter referred to as a quartz vibrator) is integrally mounted on a box-shaped ceramic circuit substrate 2. In this way, when the quartz vibrator 3 and the circuitry are separately manufactured as discrete components, variations in the manufacturing accuracy of the quartz vibrator 3 can be reduced, and the frequency accuracy of the quartz oscillator 1 can thereby be increased. In addition, since the quartz vibrator 3 is integrally mounted on the circuit substrate 2, the quartz vibrator 3 functions as a cover of the box-shaped circuit substrate 2. Thus, the number of components used is reduced and the quartz oscillator 1 can be miniaturized.

Figure 3:
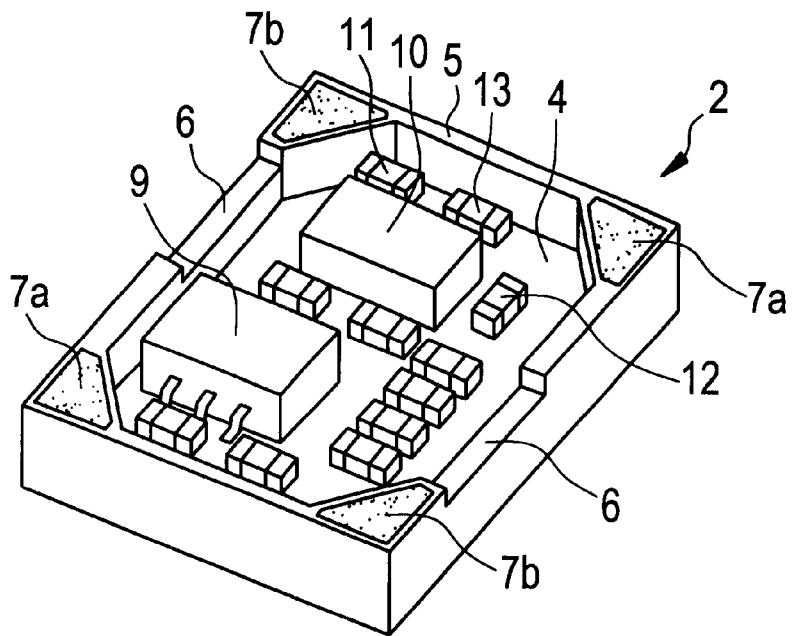
FIG. 3 is a perspective view of a circuit substrate of the quartz oscillator shown in FIG. 1, on which an oscillation circuit and other components are mounted.

First, a description will be given of the structure of the circuit substrate 2. FIG. 3 shows a perspective view of the circuit substrate 2 on which circuit components are mounted. The circuit substrate 2, which is a ceramic multilayer circuit substrate, has a cavity 4 for mounting components in the center thereof. Walls are arranged around the cavity 4. In each of the top surfaces of the predetermined opposing walls 5, a recess 6 is defined in such a manner that the top surface is partially cut away. The recess 6 is arranged to create a clearance 20 between the circuit substrate and the quartz vibrator 3. Preferably, two or more recesses are provided, and the depth of each recess is, for example, approximately 100 μm.

The positions of the recesses 6 are preferably arranged in such a manner that both recesses 6 do not face each other. In FIG. 3, the left recess 6 is positioned on the upper side, while the right recess 6 is positioned on the lower side. In addition, the recesses 6 may be formed by cutting or other methods after firing the circuit substrate 2. Alternatively, the recesses 6 may be formed during a step in which green sheets are laminated. In any case, formation of the recess 6 in the top surface of the wall 5 simplifies the manufacturing process.

Within the cavity 4, wiring patterns (not shown) are defined by thick-film conductive members and are formed by printing and firing conductive pastes. In addition, connection electrodes 7a and 7b made of thick-film conductive members are disposed on four corners of the top surfaces of the walls 5. Similarly as shown in FIG. 2, external electrodes 8 are disposed on four corners on the bottom surfaces thereof. The connection electrodes 7a and 7b disposed on the top surface corners are connected to the quartz vibrator 3. The two electrodes 7a of the four electrodes 7a and 7b are connected to terminal electrodes of the quartz vibrator 3. The other two electrodes 7b are connected to a shielding plate 17 to be used as a ground electrode. In addition, the external electrodes 8 of the bottom surfaces are used when the quartz oscillator 1 is surface-mounted on a printed circuit board. One of the external electrodes 8 is used for outputting signals, and another one is connected to a power supply line. The remaining electrodes are connected to ground lines. The connection electrodes 7a and 7b, the external electrodes 8, and the wiring patterns are connected to each other by wires embedded in the circuit substrate 2 having a multi-layer structure and via-holes formed therein, although these are not shown. Moreover, a shielding metal layer (not shown) is laminated inside the circuit substrate 2.

Circuits other than the quartz vibrator 3 in the circuits constituting the quartz oscillator 1 are provided in the circuit substrate 2. For example, an oscillation circuit, a temperature-compensating circuit, a buffer amplifier circuit, and other suitable circuits are disposed. Thus, on the circuit substrate 2, surface-mount type circuit components constituting these circuits are mounted preferably by reflow soldering. For example, an oscillation/buffer-amplifier transistor 9, a variable capacitor 10, a multi-layer capacitor 11, a temperature-compensating chip thermistor 12, a chip resistor 13, and other components are surface-mounted in the cavity 4. In addition, a printing resistor 14 is provided on the lower surface of the circuit substrate 2. The lower surface of the circuit substrate 2 is coated by an insulation film on areas except the areas where the external electrodes 8 are located.

Figure 4:
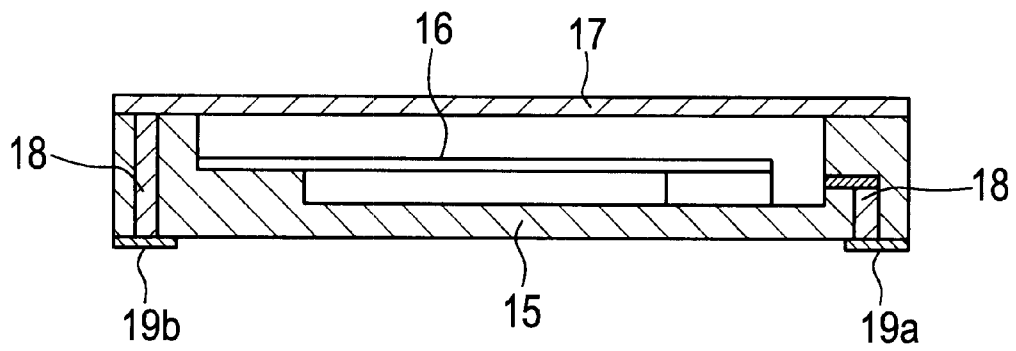
FIG. 4 is a sectional view of a quartz-vibrator package of the quartz oscillator shown in FIG. 1.

Next, the structure of the quartz vibrator 3 will be illustrated with reference to FIG. 4. A quartz member 16 is contained in a case 15 having an open upper surface. Both ends of the quartz member 16 are supported by the case 15. The shielding plate 17 shields the entire top surface of the case 15. The quartz member 16 is air-tightly contained in a package defined by the case 15 and the shielding plate 17. Electrodes 19a and 19b are disposed on the four corners of the bottom surface of the case 15. The two electrodes 19a of the electrodes 19a and 19b disposed on the four corners are connected to the electrodes of the quartz member 16 through the via-holes 18. The remaining electrodes 19b are electrically connected to the shielding plate 17 through the via-holes 18.

In this arrangement, the connection electrodes 7a on the upper surface of the circuit substrate and the electrodes 19a on the lower surface of the quartz vibrator 3 are connected to each other preferably via reflow soldering. In addition, the connection electrodes 7b on the upper surface of the circuit substrate 2 and the electrodes 19b on the lower surface of the quartz vibrator 3 are also connected to each other preferably via reflow soldering. With this arrangement, the connection electrodes 7a and 7b on the circuit substrate 2 are electrically connected to the electrodes 19a and 19b of the quartz vibrator 3, and the circuit substrate 2 and the quartz vibrator 3 are mechanically joined to each other. When the quartz vibrator 3 is integrally mounted on the circuit substrate 2, slit-shaped clearances 20 are defined between the circuit substrate 2 and the quartz vibrator 3 by the recesses 6. As a result, the inside of the circuit substrate 2 and the outside thereof are connected via the clearances 20.

The quartz oscillator 1 has the above-described structure. In the process for manufacturing the quartz oscillator 1, after printing solder pastes inside the cavity 4 of the circuit substrate 2 and on the connection electrodes 7a and 7b, circuit components are disposed on the circuit substrate 2 by a chip placer or other suitable device or process. Then, after the quartz vibrator 3 is integrally mounted on the circuit substrate 2, the quartz oscillator 1 is heated in a reflow furnace. The circuit components and the quartz vibrator 3 are soldered by reflowing a paste solder.

In order to remove flux residue left by the soldering process with a cleaning solution, the quartz oscillator 1 is put in the cleaning solution. Then, the cleaning solution enters the inside of the circuit substrate 2 through the slit-shaped clearances 20 defined on the side surfaces of the quarts oscillator 1, and the flux residue is thereby completely removed. Furthermore, after the completion of cleaning, the dirty cleaning solution can be completely discharged from the clearances 20. As a result, changes in the frequency of the quartz oscillator 1 occurring with the passage of time can be reduced. Thus, the quartz oscillator 1 can be used as a standard oscillator having high frequency accuracy over a long period of time. Moreover, even when dew condensation occurs on the quartz oscillator 1 due to it being moved from a warm place into an environment below dew point, the influence of the condensation on the circuit substrate 2 is minimized, since the moisture content quickly evaporates through the clearances 20.

In addition, since the clearances 20 are disposed in the walls 5 of the circuit substrate 2 instead of being disposed on a main surface thereof, the clearances 20 neither hinder mounting of circuit components nor restrict the design freedom of wiring patterns. Accordingly, a compact quartz oscillator can be obtained.

Furthermore, in this preferred embodiment, since the clearances 20 are disposed only on two of the opposing edges of the wall 5, the cleaning solution flows over the inside of the circuit substrate 2. Additionally, since the positions of the clearances 20 are deviated from each other, the cleaning solution flows while spreading over the entire cavity of the circuit substrate 2. Thus, the flux residue can be completely removed.

Figure 5:
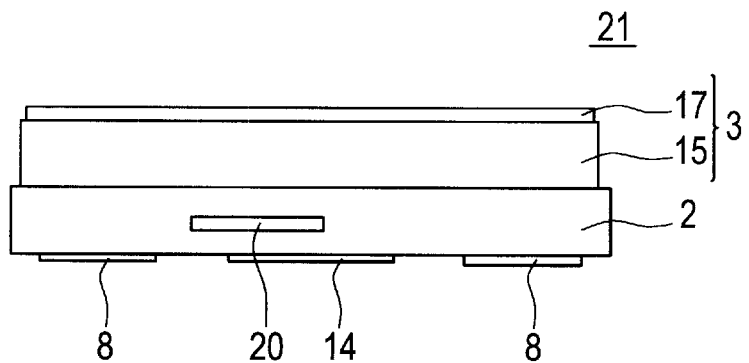
FIG. 5 is a side view of a quartz oscillator according to a second preferred embodiment of the present invention.

FIG. 5 shows a side view of the structure of a quartz oscillator 21 according to a second preferred embodiment of the present invention. In this preferred embodiment, a clearance 20 is formed by making a slit-shaped long hole on the lower edge of a wall 5 of the circuit substrate 2. Since the clearance 20 is positioned on the lower edge of the wall 5 and is in contact with the upper surface of the circuit substrate 2, a cleaning solution inside the circuit substrate 2 can easily be discharged without remaining inside.

Figure 6:
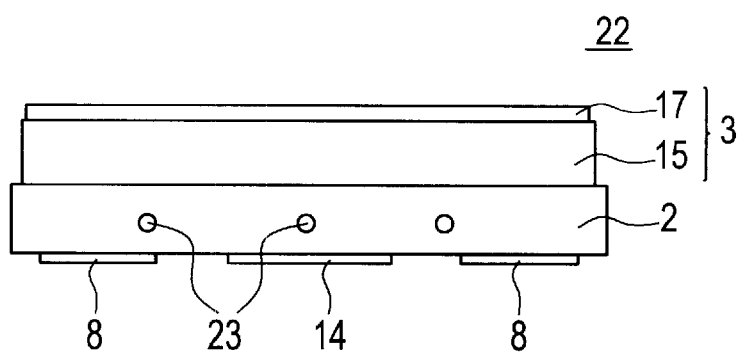
FIG. 6 is a side view of a quartz oscillator according to a third preferred embodiment of the present invention.

FIG. 6 shows a side view of the structure of a quartz oscillator 22 according to a third preferred embodiment of the present invention. In this preferred embodiment, a plurality of clearances 23 in the form of small holes are defined on the lower edge of the wall 5 of the circuit substrate 2. With this arrangement, the clearances 23 can be arranged over a plurality of separate positions without reducing the strength of the wall 5. Thus, the locations through which a cleaning solution enters can be located over a wide area. There is no problem with variations in the height of the clearances 23.

Figure 7:
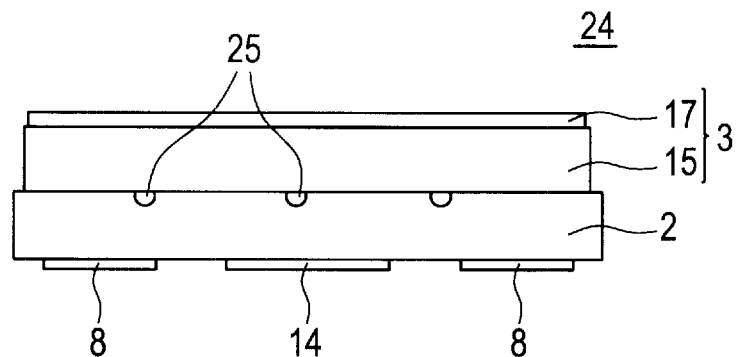
FIG. 7 is a side view of a quartz oscillator according to a fourth preferred embodiment of the present invention.

FIG. 7 shows a side view of the structure of a quartz oscillator 24 according to a fourth preferred embodiment of the present invention. In this preferred embodiment, a plurality of clearances 23 in the form of narrow groove-shaped members are defined in the top surface of a wall 5 of the circuit substrate 2.

Preferred embodiments of the present invention can be applied to any kind of quartz oscillator. For example, as described above, a temperature-compensating quartz oscillator (TCXO) additionally having a temperature-compensating circuit may be used. Alternatively, a quartz oscillator that does not perform temperature compensation (SPXO), or a voltage-controlled quartz oscillator (VCXO) may be applied to the present invention.

As described above, according to preferred embodiments of the present invention, since the clearances are disposed in the walls surrounding the cavity of the circuit substrate, a cleaning solution can easily enter the inside of the circuit substrate through the clearances thereof. Furthermore, after cleaning, the cleaning solution can be easily discharged through the clearances. In addition, even when condensation occurs inside the circuit substrate, the arrangement of the invention permits moisture content to quickly evaporate through the clearances, with the result that the influence of condensation on the circuitry is minimized.

Moreover, according to preferred embodiments of the present invention, since the wall has the clearance therein, it is unnecessary to reduce the area for mounting components on the circuit substrate, and formation of the clearances dose not hinder the design of wiring patterns. In addition, the formation of clearances does not hinder the miniaturization of the piezoelectric oscillator.

While preferred embodiments of the present invention have been described above, it is to be understood that modifications and changes will be apparent to those skilled in the art without departing from the spirit of the invention. The scope of the invention, therefore, is to be determined solely by the following claims.

What is claimed is:
1. A piezoelectric oscillator comprising:
    a circuit substrate;
    a cavity defined in the upper surface of the circuit substrate arranged to mount therein at least one circuit component to be mounted on the circuit substrate;
    a plurality of walls surrounding the cavity defined in the upper surface of the circuit substrate;
    a vibrator package containing a piezoelectric member, said vibrator package being arranged to be integrally mounted on the circuit substrate so as to cover the cavity; and
    a clearance defined in at least one of the plurality of walls surrounding the cavity of the circuit substrate to connect the inside of the cavity and the outside thereof.
2. A piezoelectric oscillator according to claim 1, wherein the clearance is defined in each of two of the plurality of walls surrounding the cavity that are opposed to each other such that the two clearances do not face each other.
3. A piezoelectric oscillator according to claim 1, wherein the clearance is defined on an edge of the at least one of the plurality of walls surrounding the cavity.
4. A piezoelectric oscillator according to claim 1, wherein the piezoelectric oscillator is a temperature-compensating-type quartz oscillator.
5. A piezoelectric oscillator according to claim 1, wherein the circuit substrate is a ceramic multi-layer circuit substrate.
6. A piezoelectric oscillator according to claim 1, wherein a recess is defined in each of the top surfaces of each pair of the plurality of walls that are disposed opposite to each other.

7. A piezoelectric oscillator according to claim 6, wherein the recesses are arranged to create a clearance between the circuit substrate and the quartz vibrator.

8. A piezoelectric oscillator according to claim 6, wherein the depth of each of the recesses is approximately 100 μm.

9. A piezoelectric oscillator according to claim 1, wherein one of the recesses is positioned on an upper portion of one of the plurality of walls and another of the recesses is positioned on a lower portion of another of the plurality of walls.

10. A piezoelectric oscillator according to claim 1, further comprising wiring patterns disposed in the cavity.

11. A piezoelectric oscillator according to claim 1, further comprising connection electrodes disposed on four corners of the top surfaces of the plurality of walls.

12. A piezoelectric oscillator according to claim 11, wherein the connection electrodes disposed on the top surface corners of the plurality of walls are connected to the quartz vibrator.

13. A piezoelectric oscillator according to claim 11, wherein two of the connection electrodes are connected to terminal electrodes of the quartz vibrator.

14. A piezoelectric oscillator according to claim 11, wherein two of the connection electrodes are connected to a ground electrode.

15. A piezoelectric oscillator according to claim 1, further comprising external electrodes disposed on four corners on the bottom surfaces of the plurality of walls.

16. A piezoelectric oscillator according to claim 1, wherein a plurality of clearances are provided in the plurality of walls and the inside of the circuit substrate and the outside thereof are connected via the plurality of clearances.

17. A piezoelectric oscillator according to claim 1, wherein the clearance is defined by a slit-shaped long hole on the lower edge of one of the plurality of walls.

18. A piezoelectric oscillator according to claim 1, wherein the clearance is defined by a plurality of holes in the lower edge of one of the plurality of walls.

19. A piezoelectric oscillator according to claim 1, wherein the clearance is defined by a plurality of narrow groove-shaped members formed in the top surface of one of the plurality of walls.

20. A piezoelectric oscillator according to claim 1, wherein the vibrator package is defined by a case and a shielding plate.

* * * * *